(12) United States Patent
Li et al.

(10) Patent No.: US 11,373,842 B2
(45) Date of Patent: Jun. 28, 2022

(54) ION BEAM ETCHING SYSTEM

(71) Applicant: JIANGSU LEUVEN INSTRUMENTS CO. LTD, Xuzhou (CN)

(72) Inventors: Na Li, Xuzhou (CN); Dongdong Hu, Xuzhou (CN); Kaidong Xu, Xuzhou (CN)

(73) Assignee: JIANGSU LEUVEN INSTRUMENTS CO. LTD, Xuzhou (CN)

( * ) Notice: Subject to any disclaimer, the term of this patent is extended or adjusted under 35 U.S.C. 154(b) by 379 days.

(21) Appl. No.: 16/631,837

(22) PCT Filed: Jun. 28, 2018

(86) PCT No.: PCT/CN2018/093270
§ 371 (c)(1),
(2) Date: Jan. 17, 2020

(87) PCT Pub. No.: WO2019/029291
PCT Pub. Date: Feb. 14, 2019

(65) Prior Publication Data
US 2020/0161088 A1      May 21, 2020

(30) Foreign Application Priority Data

Aug. 10, 2017   (CN) .......................... 201710680517.3

(51) Int. Cl.
*H01J 37/305*     (2006.01)
*H01J 37/04*      (2006.01)
*H01L 21/67*      (2006.01)

(52) U.S. Cl.
CPC .......... *H01J 37/3056* (2013.01); *H01J 37/04* (2013.01); *H01L 21/67069* (2013.01);
(Continued)

(58) Field of Classification Search
CPC .............................. H01J 37/3056; H01J 37/06
See application file for complete search history.

(56) References Cited

U.S. PATENT DOCUMENTS

| | | | |
|---|---|---|---|
| 5,252,884 | A | 10/1993 | Dona |
| 2010/0012860 | A1 | 1/2010 | Vokurka |

FOREIGN PATENT DOCUMENTS

| | | |
|---|---|---|
| CN | 2605442 Y | 3/2004 |
| CN | 1934674 A | 3/2007 |

(Continued)

*Primary Examiner* — Joseph L Williams
(74) *Attorney, Agent, or Firm* — Bayramoglu Law Offices LLC (57) ABSTRACT

An ion beam etching system includes an etching cavity, an etching electrode, and an electrode displacement apparatus used for enabling the electrode to change a working position in the etching cavity. The electrode displacement apparatus includes a dynamic sealing mechanism, a dynamic electrode balance counterweight mechanism, an electrode displacement transmission mechanism, and an electrode displacement driving mechanism. The etching cavity includes a cavity and a cavity cover connected with the cavity. The cavity is of an irregular shape. The cavity includes a partial cylindrical body, a side plate, a tapered transition portion, and a bottom plate. The partial cylindrical body is laterally sealed by means of the side plate. The bottom plate is connected to an end of the partial cylindrical body by means of the tapered transition portion and seals the end of the partial cylindrical body.

10 Claims, 5 Drawing Sheets

(52) U.S. Cl.
CPC .......... *H01J 2237/2005* (2013.01); *H01J 2237/20207* (2013.01); *H01J 2237/20278* (2013.01); *H01J 2237/3174* (2013.01)

(56) References Cited

FOREIGN PATENT DOCUMENTS

| | | | |
|---|---|---|---|
| CN | 107610994 A | | 1/2018 |
| CN | 109950121 A | * | 6/2019 |
| CN | 110429016 A | * | 11/2019 |
| DE | 102005025130 A1 | | 12/2006 |
| JP | 2013125640 A | | 6/2013 |
| JP | 2016164894 A | | 9/2016 |

* cited by examiner

ION BEAM ETCHING SYSTEM

CROSS REFERENCE TO THE RELATED APPLICATIONS

This application is the national phase entry of International Application No. PCT/CN2018/093270, filed on Jun. 28, 2018, which is based upon and claims priority to Chinese Patent Application No. 201710680517.3, filed on Aug. 10, 2017, the entire contents of which are incorporated herein by reference.

TECHNICAL FIELD

The present invention relates to the field of semiconductor etching technology, and in particular, to an ion beam etching system.

BACKGROUND

With the development of semiconductor devices, the precision of wafer patterns is getting higher and higher. Since conventional wet etching cannot meet the requirements of high-precision fine-line pattern etching due to the inevitable lateral drilling, a series of dry etching techniques have been gradually developed. Plasma etching, reactive ion etching, two-pole sputtering etching, and ion beam etching are widely applied. Reactive gases are essential for both plasma etching and reactive ion etching. Etching different materials requires different reactive gases and components, as well as different excitation methods and excitation conditions. The reactive gas is generally chloride or fluoride, and it is difficult to find a suitable reactive gas for some materials. For example, Pt is generally subjected to purely physical two-pole sputtering etching or ion beam etching. In ion beam etching, ions are provided by means of an ion source, so that the ion energy is low, the density is high, the damage to a substrate is small, and the etching rate is fast. Because of no material selectivity, the ion beam etching is especially suitable for the thinning of materials that are difficult to be thinned with chemical grinding and electrolytic grinding. In addition, the ion beam etching is anisotropic etching, so the pattern transfer precision is high, and the line width loss of fine lines is low. The ion beam etching only uses nitrogen without the need for reactive gases, so the process is safe, the environment pollution is low, and the operation cost is low. Therefore, the ion beam etching is especially suitable for precise ultra-thin film etching and materials that are difficult to etch with chemical methods.

In the manufacturing processes of semiconductor devices and wafers, the etching process is the most frequently used one. Some materials on the wafer may be partially or completely etched or removed in the etching process of integrated circuit fabrication. Plasma etching and Ion Beam Etching (IBE) processes are increasingly important in all etching processes. Especially with the increase of wafer integration, the reduction of critical dimensions, high selection ratio, precise pattern transfer and other process requirements, the advantages of plasma etching and ion beam etching are highlighted.

As the critical structure of the wafer shifts from planar to 3D structures (e.g., Fin Field Effect Transistor (FinFET) structures in logic devices) and advanced memory structures (e.g., a Magnetic Random Access Memory (MRAM) and a Resistive Random Access Memory (ReRAM)), these device structures require ever higher precision, repeatability, and process quality requirements for the etching process. In the manufacturing process of these devices such as MRAM, many special metal materials and metal compound materials require the etching process. Most by-products of the etching reaction generated in the plasma etching process are also metal or metal-rich films. If the sidewalls of some patterns subjected to the etching process are not steep, the process is also required for additional finishing. It is found through experiments that ion sputtering during the ion beam etching can greatly improve the three problems above. In addition, researchers should note that the use of ion beam etching may cause damage to existing devices or wafer structures. Therefore, there is an urgent need to design an improved ion beam etching system to solve such problems in the process of manufacturing advanced devices.

The vacuum cavities of the existing ion beam etching system are of a relatively regular cylindrical or rectangular shape, which occupies a relatively large space and is relatively cumbersome, and the surfaces of the cylindrical or rectangular cross-section cavities connected with other external devices are front and rear planes, and the size of the planes is determined by the diameter of the cylindrical surface. In the existing design, the volumes of such cavities are relatively large, and the diameter of the cylindrical surface is also large, causing that the front and rear planes occupy a large space in the left rear direction. When the device is, on the surface, connected to a device component occupying a large external space and having a feature that both ends are bent and extended toward the device, there is a high possibility of interference between the two devices, causing that the ion beam etching system is restricted in use and thus is subjected to more restrictions when connected to other external devices.

SUMMARY

To solve the technical defects in the prior art that the etching system would easily damage the device or the wafer structure, the etching pattern is not high in precision, the occupied space is large, and the etching system is subjected to many restrictions when connected to other devices in operation, the present invention provides an ion beam etching system, which occupies a reasonable space, can be conveniently connected to other devices in operation, and can implement multi-angle etching.

To achieve the foregoing objective, the present invention provides an ion beam etching system, comprising an etching cavity and an etching electrode, and further comprising an electrode displacement apparatus used for enabling the electrode to change a working position in the etching cavity. The electrode displacement apparatus comprises a dynamic sealing mechanism, a dynamic electrode balance counterweight mechanism, an electrode displacement transmission mechanism, and an electrode displacement driving mechanism.

In the ion beam etching system of the present invention, preferably, the etching cavity comprises a cavity and a cavity cover connected with the cavity, and the cavity is of an irregular shape.

In the ion beam etching system of the present invention, preferably, the cavity comprises a partial cylindrical body, a side plate, a tapered transition portion, and a bottom plate. The partial cylindrical body is laterally sealed by means of the side plate. The bottom plate is connected with one end of the partial cylindrical body by means of the tapered transition portion and seals the end of the partial cylindrical body.

In the ion beam etching system of the present invention, preferably, a circular hole for mounting an ion source is formed on the side plate, and a rectangular window for a substrate transfer mechanism to pass in and out is formed on the bottom plate.

In the ion beam etching system of the present invention, preferably, an end face flange is welded on the partial cylindrical body of the cavity, a sealing groove is formed on the end face flange, and the cavity cover is connected with the cavity by means of a static sealing structure composed of a sealing ring and the sealing groove.

In the ion beam etching system of the present invention, preferably, the dynamic sealing mechanism is mounted on the cavity cover, and the dynamic sealing mechanism is a magnetic fluid sealing apparatus.

In the ion beam etching system of the present invention, preferably, the electrode displacement transmission mechanism comprises a rocker arm, a transition shaft, and a coupling. The rocker arm is mounted inside the cavity. One end of the rocker arm is connected with the etching electrode, and the other end of the rocker arm is connected with a rotor that extends to the interior of the cavity.

In the ion beam etching system of the present invention, preferably, the electrode displacement driving mechanism is a motor, an electric cylinder, or an air cylinder.

In the ion beam etching system of the present invention, preferably, the dynamic electrode balance counterweight mechanism comprises a counterweight plate and a counterweight block. The counterweight plate is fixed on the rotor close to the transition shaft. The counterweight block is fixed on the counterweight plate in the vertical axis direction of the rotor.

In the ion beam etching system of the present invention, preferably, the etching electrode can be positioned at more than three working positions for etching.

1—etching cavity; 2—etching electrode; 3—dynamic sealing mechanism; 4—dynamic electrode balance counterweight mechanism; 5—electrode displacement transmission mechanism; 6—electrode displacement driving mechanism; 7—cavity; 8—cavity cover; 9—stator; 10—rotor; 11—rocker arm; 12—transition shaft; 13—coupling; 14—counterweight plate; 15—counterweight block; 16—through hole; 17—counterweight plate on-axis position; 18—counterweight plate parallel-axis position; 19—counterweight plate under-axis position; 20—electrode under-axis position; 21—electrode parallel-axis position; 22—electrode on-axis position; 23—partial cylindrical body; 24—side plate; 25—tapered transition portion; 26—bottom plate; 27—circular hole; 28—rectangular window; 29—sealing groove.

DETAILED DESCRIPTION OF THE EMBODIMENTS

To make the objectives, technical solutions and advantages of the present invention clearer, the technical solutions in embodiments of the present invention are clearly and completely described below with reference to the accompanying drawings in the embodiments of the present invention. It should be understood that the specific embodiments described herein are merely illustrative of the present invention and are not intended to limit the present invention. The described embodiments are only a part of the embodiments of the present invention, and not all of the embodiments. All other embodiments obtained by those skilled in the art based on the embodiments of the present invention without involving an inventive effort fall within the scope of protection of the present invention.

In the description of the present invention, it should be noted that the orientation or positional relationships indicated by the terms "up", "down", "horizontal", and "vertical", etc., are based on the orientation or positional relationships shown in the drawings, and are merely intended to facilitate describing the present invention and simplifying the present invention, instead of indicating or implying that the devices or components in the description must have a specific orientation and are constructed and operated in a specific orientation, and thus cannot be understood as the limitations of the present invention. In addition, in the description of the present invention, it should be understood that, unless otherwise specified and defined, the terms "connected with" and "connected to" should be comprehended in a broad sense. For example, these terms may be comprehended as being fixedly connected, detachably connected or integrally connected; mechanically connected or electrically connected; or directly connected or indirectly connected through an intermediate medium, or in an internal communication between two components. The "motor" in the present invention means an electric motor unless otherwise specified. The specific meanings about the foregoing terms in the present invention may be understood for those skilled in the art according to specific circumstances.

Figure 1:
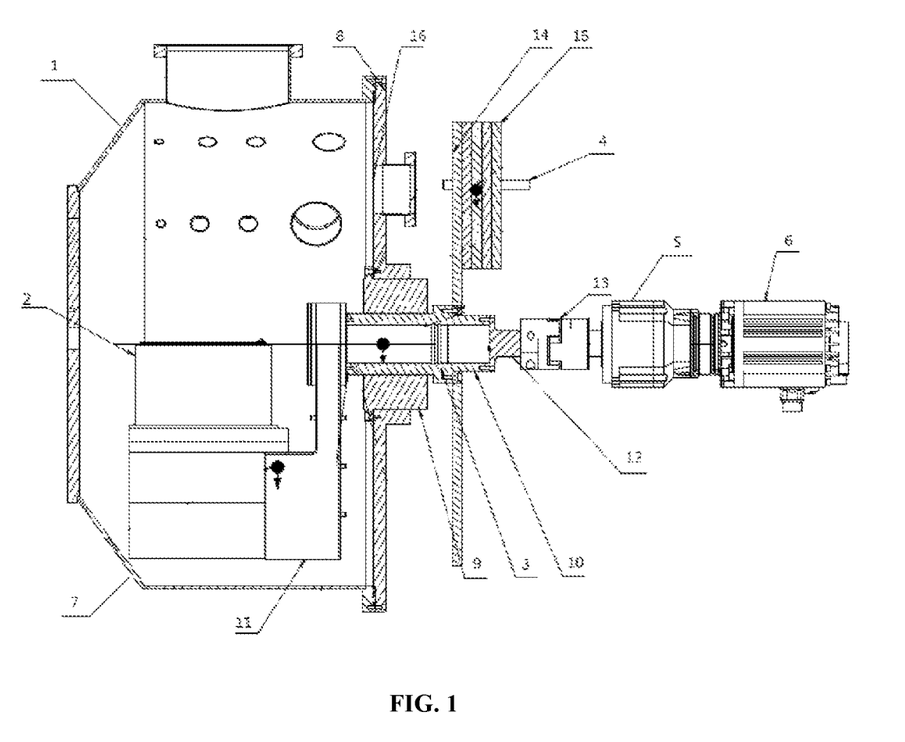
FIG. 1 is a cross-sectional view of an ion beam etching system according to the present invention.

FIG. 1 is a cross-sectional view of an ion beam etching system according to the present invention. As shown in FIG. 1, an ion beam etching system of the present invention comprises an etching cavity 1 and an etching electrode 2, and further comprises an electrode displacement apparatus used for enabling the etching electrode 2 to change a working position in the etching cavity 1. The electrode displacement apparatus comprises a dynamic sealing mechanism 3, a dynamic electrode balance counterweight mechanism 4, an electrode displacement transmission mechanism 5, and an electrode displacement driving mechanism 6.

In the working process of the ion beam etching system of the present invention, the etching cavity 1 is connected with an external ion beam source, a vacuum apparatus, and a wafer transfer apparatus (all not shown), respectively. The ion beam source is used to emit an ion beam into the etching cavity. The vacuum apparatus is used to supply and maintain a vacuum environment inside the etching cavity 1. The wafer transfer apparatus transfers a wafer to be etched into the interior of the etching cavity 1. The etching electrode 2 is driven by the electrode displacement apparatus to change the working position, so as to etch the wafer at different angles.

In the ion beam etching system of the present invention, the etching cavity 1 includes a cavity 7 and a cavity cover 8 connected with the cavity 7, and the cavity 7 is of an irregular shape. By designing the cavity 7 as an irregular structure, the volume of the entire cavity can be reduced, and no interference is generated when it is connected with an external device, and it is also more flexible when installed with other devices.

In the ion beam etching system of the present invention, an end face flange is welded on a cylinder of the cavity 7, a sealing groove is formed on the end face flange, and the cavity cover 8 is connected with the cavity 7 by means of a static sealing structure composed of a sealing ring and the sealing groove.

In the ion beam etching system of the present invention, the dynamic sealing mechanism is mounted on the cavity cover 8, and the dynamic sealing mechanism is a magnetic fluid sealing apparatus. Specifically, the magnetic fluid sealing apparatus includes a stator 9 and a rotor 10. The stator 9 is fastened to the cavity cover 8 by means of a bolt when the magnetic fluid sealing apparatus is mounted on the cavity cover 8. The sealing groove may be disposed between the stator 9 and the rotor 10. The sealing ring is placed in the sealing groove to ensure that there is no air leakage inside the vacuum cavity. One end of the rotor 10 extends to the interior of the cavity 7, and the other end of the rotor 10 is connected to the electrode displacement transmission mechanism outside the cavity 7. The magnetic fluid sealing technology is developed on the basis of a magnetic fluid. When the magnetic fluid is injected into a gap of a magnetic field, the entire gap can be filled with the magnetic fluid to form a "liquid O-ring". The function of the magnetic fluid sealing apparatus is to transmit rotational motion into a sealed container. In the present invention, the magnetic fluid sealing apparatus can be used to connect the cavity to the cavity cover more closely to ensure a high vacuum environment inside the cavity.

In the ion beam etching system of the present invention, the electrode displacement transmission mechanism includes a rocker arm 11, a transition shaft 12, and a coupling 13. The rocker arm 11 is mounted inside the cavity 7. One end of the rocker arm 11 is connected with the etching electrode 2, and the other end of the rocker arm 11 is connected with the rotor 10 which extends to the interior of the cavity 7. The rotor 10 can be connected to the electrode displacement driving mechanism 6 by means of the electrode displacement transmission mechanism 5. The electrode displacement driving mechanism 6 drives the rotor 10 to rotate by means of the electrode displacement transmission mechanism 5, so as to drive the rocker arm 11 to rotate, such that the etching electrode 2 changes the working position.

In the ion beam etching system of the present invention, the dynamic electrode balance counterweight mechanism includes a counterweight plate 14 and a counterweight block 15. The counterweight plate 14 is fixed on the rotor 10 close to the transition shaft. The counterweight block 15 is fixed on the counterweight plate 14 in the vertical axis direction of the rotor. When the etching electrode 2 changes the working position, the rotor 10 is rotated about the axis of the rotating shaft with the torque output from the electrode displacement driving mechanism 6, and the rocker arm 11 can, with the electrode assembly, be synchronously rotated about the axis of the rotating shaft. Since the weights of the rocker arm and the electrode assembly are relatively large, and the center of gravity is below the axis, the magnetic fluid sealing apparatus is subjected to an excessive eccentric bending moment during the rotation, the magnetic fluid sealing apparatus is easily damaged, and the rotation is not smooth. With regards to this, in the ion beam etching system of the present invention, a dynamic electrode balance counterweight mechanism is disposed outside the cavity 7 and is synchronously rotated with the rotor 10. When the rotor 10 drives the rocker arm 11, the electrode assembly, the counterweight plate 14 and the counterweight block 15 to rotate together, i.e., on the axis of the cavity, the magnetic fluid sealing apparatus only receives the torque output by the electrode displacement driving mechanism 6 during rotation, and does not receive the radial force, which makes the rotation smooth, so as to prolong the service life.

In the ion beam etching system of the present invention, a plurality of through holes 16 may also be formed on the cavity cover, and various standard flanges and pipes may be welded on the through holes 16, and an external observation window may be connected to observe the process conditions in the vacuum cavity in each stage of the ion beam etching process.

In the ion beam etching system of the present invention, by providing the dynamic sealing apparatus 3, the dynamic electrode balance counterweight mechanism 4, the electrode displacement transmission mechanism 5, and the electrode displacement driving mechanism 6, a heavier electrode assembly composed of the etching electrode 2 can be smoothly positioned at three or more working positions for ion beam etching. Thus, ion beam etching can be performed on the wafer at different angles.

Figure 2:
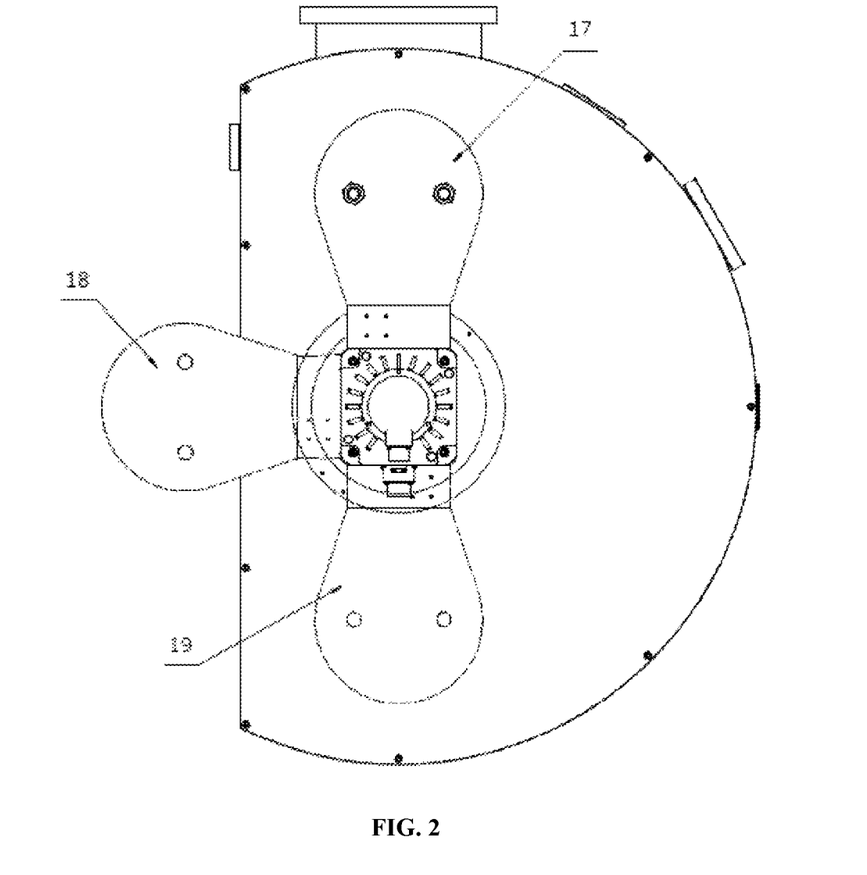
FIG. 2 is a schematic diagram showing three positions of a counterweight plate of an ion beam etching system according to the present invention during rotation.
Figure 3:
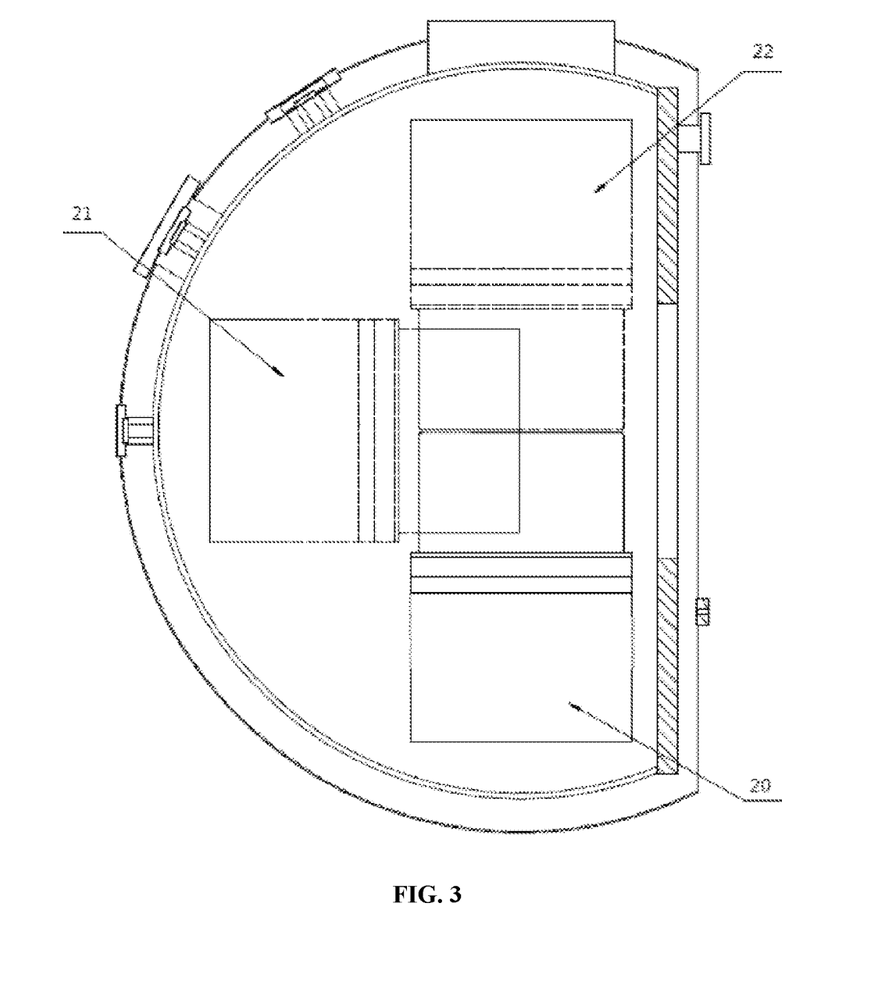
FIG. 3 is a schematic diagram showing three positions of an electrode assembly of an ion beam etching system according to the present invention.

FIG. 2 is a schematic diagram showing three positions of a counterweight plate of an ion beam etching system according to the present invention during rotation. FIG. 3 is a schematic diagram showing three positions of an electrode assembly of an ion beam etching system according to the present invention. In the ion beam etching system of the present invention, the counterweight plate 14 on which the counterweight block 15 is placed can be positioned at three positions during operation, i.e., a counterweight plate on-axis position 17, a counterweight plate parallel-axis position 18, and a counterweight plate under-axis position 19, as shown in FIG. 2. Accordingly, the electrode assembly composed of the etching electrode 2 can be positioned at three working positions, i.e., an electrode under-axis position 20, an electrode parallel-axis position 21, and an electrode on-axis position 22, as shown in FIG. 3.

Figure 4:
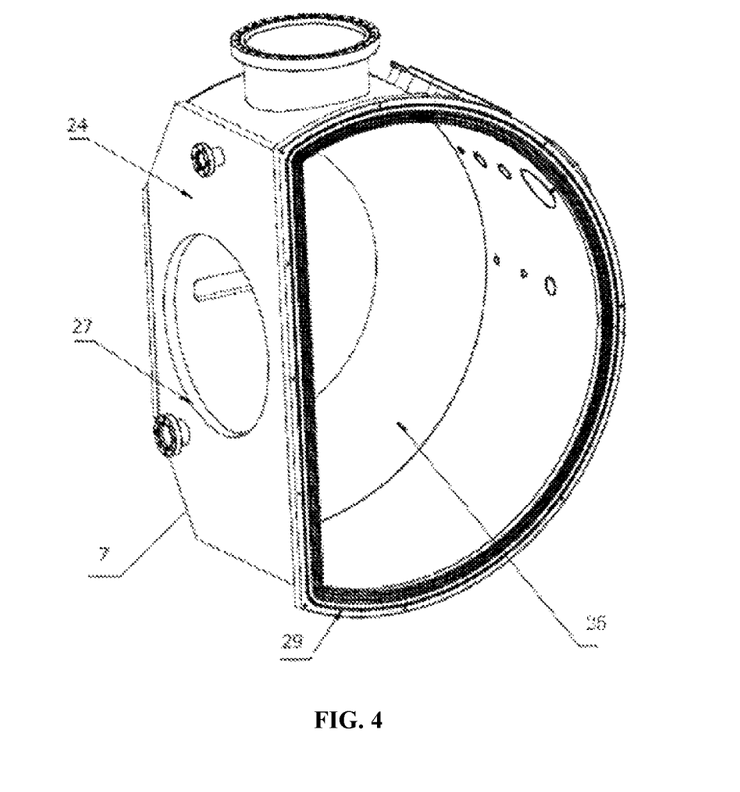
FIG. 4 is a perspective view showing the internal structure of an etching cavity of an ion beam etching system according to the present invention.
Figure 5:
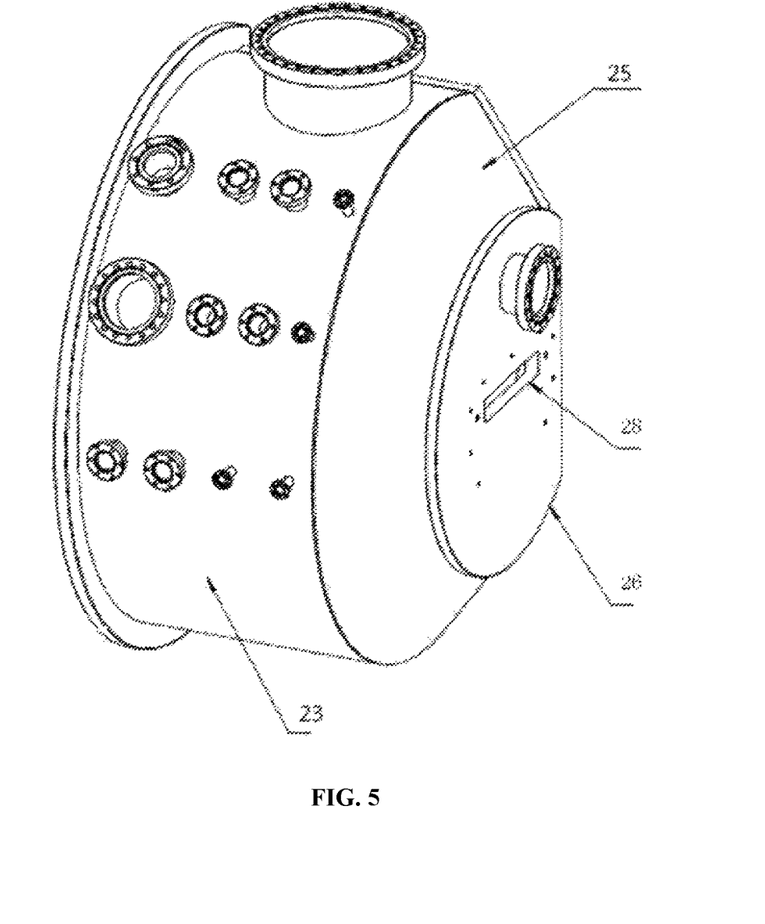
FIG. 5 is a perspective view showing the external structure of an etching cavity of an ion beam etching system according to the present invention.

FIG. 4 is a perspective view showing the internal structure of an etching cavity of an ion beam etching system according to the present invention. FIG. 5 is a perspective view showing the external structure of an etching cavity of an ion beam etching system according to the present invention. As shown in FIGS. 4 and 5, in the ion beam etching system of the present invention, preferably, the cavity 7 includes a partial cylindrical body 23, a side plate 24, a tapered transition portion 25, and a bottom plate 26. The partial cylindrical body 23 is laterally sealed by means of the side plate 24. The bottom plate 26 is connected with one end of the partial cylindrical body 23 by means of the tapered transition portion 25 and seals the end of the partial cylindrical body 23. An end face flange is welded to the other end of the partial cylindrical body 23, a sealing groove 29 is formed in the flange, and a sealing ring is placed in the sealing groove. The cavity cover 8 is mounted on the flange by means of a bolt, and is connected by means of a static sealing structure composed of a sealing groove 29 and a sealing ring. Therefore, in addition to the dynamic sealing structure, the present invention is further provided with a static sealing structure composed of a sealing groove and a sealing ring at the junction of the cavity cover and the cavity, thereby maximally ensuring a vacuum environment inside the cavity.

Specifically, the partial cylindrical body 23 in the ion beam etching system of the present invention can be obtained by trimming one side of a cylindrical cavity, and the partial shape thereof can be adjusted according to actual installation needs. The cross-section profile of the trimmed cylindrical body is a combination of an arc line and a straight line, and this can be accomplished by welding with a stainless steel plate. The shape of the cavity 7 can be flexibly adjusted according to specific installation conditions to make it more space-saving and easy to operate when connected to other devices.

The tapered transition portion 25 in the ion beam etching system of the present invention has a large taper such that the diameter of the bottom plate 26 is much smaller than the diameter of the partial cylindrical body 23. Therefore, the size of the tail end of the cavity is miniaturized to a great extent. Since the installation design of the cavity for ion beam etching has fewer restrictions, during the connection with an external transmission mechanism, a connection surface of the device provides a large open space by means of a necking feature of the tapered end, and does not limit the structural form of the external transmission mechanism, so that the ion beam etching system is reduced in volume and has high adaptability. The tapered transition portion 25 is a connecting segment that is formed by bending a steel plate and has a trapezoidal longitudinal section. The transition portion is an arc, but the shape is not limited thereto, and can be arbitrarily adjusted according to the specific implementation of the cavity body.

In the ion beam etching system of the present invention, by providing the tapered transition portion 25 at the cylindrical tail end, a contraction tendency is formed at the tail end of the partial cylindrical body 23, and a steel plate is welded at the neck, thereby forming a cavity of an irregular shape. Such a design can reduce the overall floor space of the cavity, no interfere is generated when it is connected with external devices, and the installation is more flexible.

In addition, a circular hole 27 for mounting an ion source may be formed on the side plate 24, and a rectangular window 28 for a substrate transfer mechanism to pass in and out is formed on the bottom plate 26. Connection with external devices such as an ion source and a transmission mechanism may be implemented by means of the circular hole 27 and the rectangular window 28 respectively, such that the external devices are not interfered with each other.

In the ion beam etching system of the present invention, the electrode displacement driving mechanism is a motor, an electric cylinder, or an air cylinder. The motor is preferably a stepper motor.

The above are only specific implementations of the present invention, but the protection scope of the present invention is not limited thereto. Any change or replacement that can be easily conceived by those skilled in the art within the technical scope disclosed by the present invention should be covered by the protection scope of the present invention.

What is claimed is:

1. An ion beam etching system, comprising:
    an etching cavity, and
    an etching electrode;
    wherein
    the ion beam etching system further comprises an electrode displacement apparatus configured to allow the etching electrode to change a working position in the etching cavity, and the electrode displacement apparatus comprises a dynamic sealing mechanism, a dynamic electrode balance counterweight mechanism, an electrode displacement transmission mechanism, and an electrode displacement driving mechanism.

2. The ion beam etching system according to claim 1, wherein,
    the etching cavity comprises a cavity and a cavity cover, wherein the cavity cover is connected to the cavity, and the cavity is of an irregular shape.

3. The ion beam etching system according to claim 2, wherein,
    the cavity comprises a partial cylindrical body, a side plate, a tapered transition portion, and a bottom plate; the partial cylindrical body is laterally sealed by means of the side plate; and the bottom plate is connected to an end of the partial cylindrical body by means of the tapered transition portion and seals the end of the partial cylindrical body.

4. The ion beam etching system according to claim 2, wherein,
    a circular hole configured to mount an ion source is formed on the side plate; and a rectangular window configured to allow a substrate transfer mechanism to pass in and out is formed on the bottom plate.

5. The ion beam etching system according to claim 2, wherein,
    an end face flange is welded on a partial cylindrical body of the cavity; a sealing groove is formed on the end face flange; and the cavity cover is connected to the cavity by means of a static sealing structure, wherein the static sealing structure is composed of a sealing ring and the sealing groove.

6. The ion beam etching system according to claim 2, wherein,
    the dynamic sealing mechanism is mounted on the cavity cover; and the dynamic sealing mechanism is a magnetic fluid sealing apparatus.

7. The ion beam etching system according to claim 1, wherein,
    the electrode displacement transmission mechanism comprises a rocker arm, a transition shaft, and a coupling; the rocker arm is mounted inside a cavity; and a first end of the rocker arm is connected to the etching electrode, and a second end of the rocker arm is connected to a rotor, wherein the rotor extends to an interior of the cavity.

8. The ion beam etching system according to claim 1, wherein,
    the electrode displacement driving mechanism is a motor, an electric cylinder, or an air cylinder.

9. The ion beam etching system according to claim 1, wherein,
    the dynamic electrode balance counterweight mechanism comprises a counterweight plate and a counterweight block; the counterweight plate is fixed on a rotor close to a transition shaft; and the counterweight block is fixed on the counterweight plate in a vertical axis direction of the rotor.

10. The ion beam etching system according to claim 9, wherein, the etching electrode is positioned at more than three working positions to perform an etching.

* * * * *